United States Patent [19]

Miyagawa et al.

[11] Patent Number: 4,890,155

[45] Date of Patent: Dec. 26, 1989

[54] PACKAGE FOR MOUNTING A SEMICONDUCTOR CHIP OF ULTRA-HIGH FREQUENCY

[75] Inventors: Fumio Miyagawa; Hiroyuki Sakai, both of Nagano; Toshikazu Takenouchi, Nakano, all of Japan

[73] Assignee: Shinko Electric Industries Co., Ltd., Nagano, Japan

[21] Appl. No.: 184,775

[22] Filed: Apr. 22, 1988

[51] Int. Cl.⁴ .............................................. H01L 23/02
[52] U.S. Cl. .......................................... 357/74; 357/80; 357/68
[58] Field of Search ............................ 357/74, 80, 68

[56]  References Cited

U.S. PATENT DOCUMENTS 4,717,948  1/1988  Sakai et al. ............................ 357/80

FOREIGN PATENT DOCUMENTS 55-86144  6/1980  Japan ................................. 357/74 B
55-95343  7/1980  Japan ................................. 357/74 C Primary Examiner—Andrew J. James
Assistant Examiner—Mark Prenty
Attorney, Agent, or Firm—Staas & Halsey

[57]  ABSTRACT

A semiconductor chip, which operates in a range of ultra-high frequency, is mounted on a package including an insulation layer on which input and output conductive patterns are formed. A metalized layer and via holes filled with conductive material are provided in the insulation layer to adjust the characteristic impedance of the conductive patterns.

11 Claims, 11 Drawing Sheets

4,890,155

PACKAGE FOR MOUNTING A SEMICONDUCTOR CHIP OF ULTRA-HIGH FREQUENCY

BACKGROUND OF THE INVENTION

1. Field of the invention

This invention relates to a chip package for mounting, for example, a semiconductor chip of ultra-high frequency which can operates within a range of so-called ultra-high actuating frequency, such as 3 GHz to 50 GHz.

2. Description of the Related Art

In the prior art, there is known a package for mounting a chip, for example, a semiconductor chip, shown in FIGS. 21 through 23. FIG. 21 is a partially broken plan view for illustrating such a known package 1. FIGS. 22 and 23 are front elevational views, partially shown in vertical cross-sections, for illustrating the packages. The construction of this package will now be briefly described. The package 1 generally comprises: a metal substrate 4 (as shown in FIG. 22) or a lower insulation layer 6a made of, for example, ceramic (as shown in FIG. 23) defining a chip mount surface 2; a bonding layer 3 formed on the chip mount surface 2 for mounting thereon a chip, such as, a semiconductor chip; and an intermediate insulation layer 6b made of, for example, ceramic laminated on the metal substrate 4 or the lower insulation layer 6a and having a rectangular recess 5 for accommodating a chip, such as, a semiconductor chip. Input/output conductive patterns 7 made of, for example, metallized layers, are formed on the intermediate insulation layer 6b. Laminated on this intermediate layer 6b is an upper insulation layer 6c made of, for example ceramic and provided with metallized seal layer 8 covered with a seal cap (not shown) so as to partially cover the conductive patterns 7 on the intermediate layer 6b. The packages shown in these drawings have multi-layer construction, as mentioned above.

Recently, however, a semiconductor chip of ultra-high frequency which operates in a range of ultra-high frequency, i.e., more than 10 GHz, has been developed. For this sake, a package becomes necessary to accommodate therein a highly integrated chip. Under these situations, the pitch of the conductive patterns 7 formed on the intermediate insulation layer 6b and under the upper insulation layer 6c, i.e., the pattern pitch of the inner lead portion 7a of the package 1, shown in FIG. 24, must necessarily be minimized to conform to the pitch of the connecting patterns of the chip which is to be mounted on the metal substrate 4a or the lower insulation layer 6a.

In this known package 1, the width C of the conductive patterns 7, made of metallized layer, formed on the upper surface of the intermediate insulation layer 6b located outside the upper insulation layer 6c, i.e., the outer leads 7b shown in FIG. 24, must necessarily be enough in such a manner that the lead lines 9 can be easily connected to the outer lead portions 7b. Also, if a semiconductor chip of ultra-high actuating frequency is to be accommodated in the above-mentioned known package 1, the widths A and C of the inner and outer lead portions 7a and 7b must necessarily be the same to each other, as shown in FIG. 24, so as to match the characteristic impedance of the conductive patterns 7. For this purpose, if a highly integrated semiconductor chip of ultra-high actuating frequency was accommodated in the known package 1, the gap remaining between the adjacent inner leads 7a would be very small. This results in a problem that the insulation performance between the adjacent inner leads 7a would be reduced so that cross-talk between the adjacent inner leads 7a would be increased.

In a known package 1 as mentioned above, some proposals have been made. For example, the pattern width A of the inner lead portion 7a is formed smaller than the pattern width C of the outer lead portion 7b so as to conform to the width of the connecting pattern of the chip which is to be accommodated in the package, while matching the characteristic impedance of the conductive patterns 7 comprising inner and outer leads 7a and 7b, by locally changing the thickness of the insulative layer just below the inner leads 7a, or using insulative material having different permittivity at positions just below the inner leads 7a.

However, this solution is inappropriate and not practical, since if a package were manufactured as mentioned above, the mechanical strength of the package 1 would be reduced so that the package would easily be bent or curved and it would be far more difficult to manufacture such a package.

SUMMARY OF THE INVENTION

An object of the present invention is to provide a package for mounting thereon a highly integrated semiconductor chip which operates in a range of ultra-high frequency, in which the pattern width A of the inner lead portion 7a can be formed smaller regardless of the pattern width C of the outer lead portion 7b, while the characteristic impedance of the conductive patterns 7 is matched.

Another object of the present invention is to provide such a package which can be easily manufactured and has a high insulation performance.

As shown in FIGS. 1 through 15, according to the present invention, there is provided a package 10 for mounting thereon a chip, such as a semiconductor chip, which can operate in a range of ultra-high frequency, comprising: an insulation layer 6 on which input and output conductive patterns 70 are formed; and an adjusting means including electrical conductive material 12 provided in said insulation layer 6 in the vicinity of said conductive patterns 70 for adjusting the characteristic impedance of said conductive patterns 70.

In the package 10 according to the present invention, the effective permittivity of the insulation layer, around the positions where the above-mentioned adjusting means are provided, can easily be locally increased or decreased in comparison with the other portions of this insulation layer, by appropriately selecting the positions where the adjusting means should be formed, and the quantity or kind of material of such adjusting means.

Therefore, the pattern width of the inner or outer lead portion of each conductive pattern formed on the insulation layer can advantageously be smaller or larger, regardless of the pattern width of the other portion of the same conductive pattern, so as to conform to the pattern pitch and/or the width of leads of the highly integrated semiconductor chip which is to be accommodated in this package.

The package according to the present invention can easily be manufactured in a process of mass-production, in substantially the same process as manufacturing conventional packages, by simultaneously forming an adjusting conductive layer and via holes filled with conductive material in the insulation layer with the metallized conductive patterns which should be formed on the upper surface of the insulation layer.

In the package according to the present invention, it is also possible to locally change the thickness of the insulation layer, as a step, or to widely arrange or scatter, within the insulation layer, the adjusting material for adjusting the characteristic impedance of the conductive patterns, without using an insulative material having a different permittivity at positions just below the inner leads. Therefore, the package of this invention can be made of a uniform insulative substance over substantially the whole area thereof, without locally cutting off the insulative substance, so that the mechanical strength of the package can be satisfactorily maintained and deformation or bending of the package can advantageously be prevented.

BRIEF DESCRIPTION OF THE DRAWINGS

FIGS. 1 through 15 illustrate preferred embodiments of a package according to the present invention; wherein, FIG. 1 is a plan view of conductive patterns of a package of an embodiment, and FIG. 2 is a cross-sectional view of the same package;

FIG. 3 is a plan view of conductive patterns of another package of this invention, and FIG. 4 is a cross-sectional view of the same package;

FIGS. 5 and 6, 7 and 8, and 9 and 10 are partial plan views and cross-sectional views, respectively, of still other embodiments of this invention;

FIG. 11 is a vertical cross-sectional view of a further embodiment of this invention, FIG. 12 is a plan view thereof, and FIGS. 13 and 14 are horizontal cross-sectional views taken along lines X III—X III and X IV—X IV in FIG. 11, respectively;

FIG. 15 is a cross-sectional view of a still further embodiment of this invention;

DESCRIPTION OF THE PREFERRED EMBODIMENTS

Figure 1:
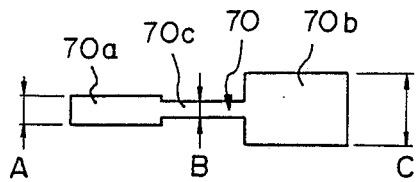

Referring now to the drawings, wherein FIGS. 1 through 15 illustrate some preferred embodiments of this invention, the parts of the package of this invention which are the same or corresponding to those of the known package described above will be referred to by the same or corresponding numerals or marks and the explanations thereof will be omitted.

Figure 2:
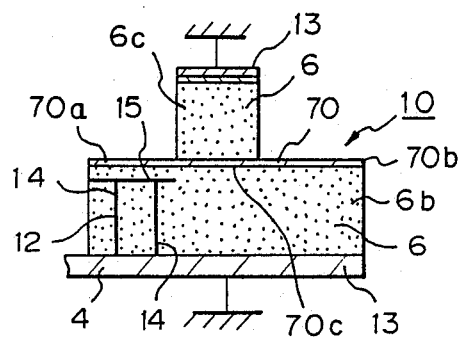

FIGS. 1 and 2 illustrates an embodiment of a package for a semiconductor chip of ultra-high frequency, in which FIG. 1 is a plan view of the conductive passage or transmission line 70 in the package, and FIG. 2 is a cross-sectional view of the same package. This package 10 comprises an insulation layer 6, including an intermediate insulation layer 6b, made of an alumina ceramic having a permittivity of 8.0. The pattern pitch of the conductive passages 70 formed on the upper surface of the intermediate insulation layer 6b is 0.6 mm and the pattern length of the conductive passages 70 is 2 mm. Thickness of the intermediate insulation layer 6b is 0.4 mm and the thickness of the upper insulation layer 6c is also 0.4 mm. In order to reduce the pattern width A of the inner lead portions 70a of the passages 70 to 0.2 mm from 0.5 mm, which is the same width of the outer leads 70b, in such a manner that the characteristic impedance of the passages 70 is matched to 50 ohm, a horizontal adjusting layer 15, made of metallized film, for adjusting the characteristic impedance of the passages 70 is provided in the intermediate insulation layer 6b at a position coming downward, by 0.17 mm, from the lower surface of the inner leads 70a. Also, a plurality of via holes 14 filled with conductive material 12 are provided to extend downward from the adjusting layer 15 to a ground layer 13. The package 10 of the first embodiment is constructed as mentioned above.

Figure 24:
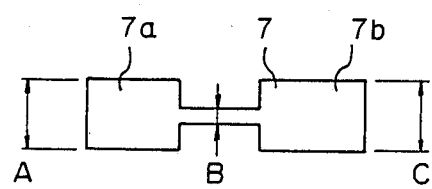
Figure 25:
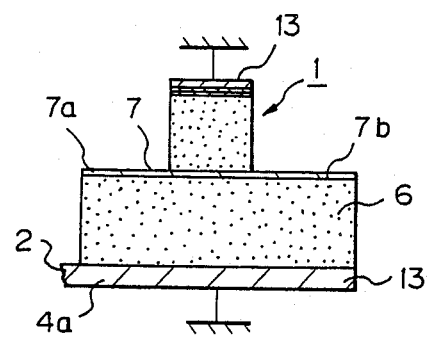
Figure 26:
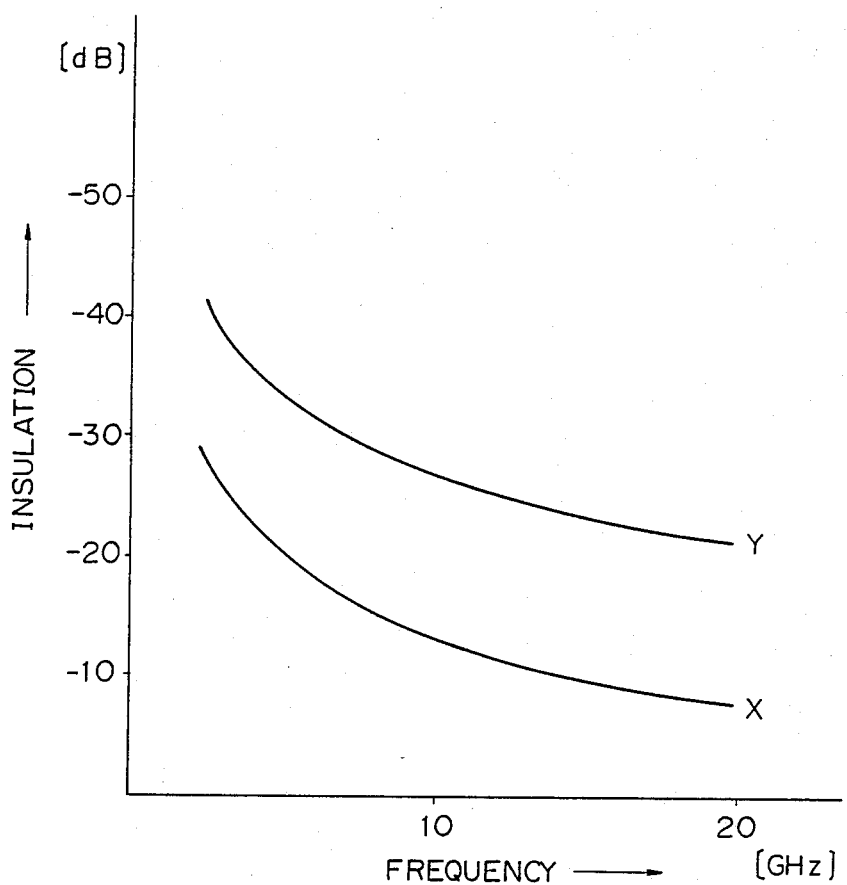
FIG. 26 is a diagram for showing the comparative data concerning the insulation performance in a package of this invention, as shown in FIGS. 1 and 2, and a known package, as shown in FIGS. 24 and 25.

A semiconductor chip of ultra-high frequency was mounted on the above-mentioned package 10 in order to experimentally measure the insulation performance between the adjacent input/output conductive passages 70 in a condition of ultrahigh frequency. As shown in FIG. 26, the package 10 known in the prior art as explained with reference to FIGS. 24 and 25, has an insulation characteristic as shown by a curve "X" and, on the other hand, the package according to this embodiment has an insulation characteristic as shown by a curve "Y", which is superior to "X" by more than $-10$ dB in a range of 10 to 20 GHz. It has been found, therefore, that the package 10 of this embodiment fully satisfies the functions required as a package for accommodating therein a highly integrated semiconductor chip of ultra-high frequency.

Figure 3:
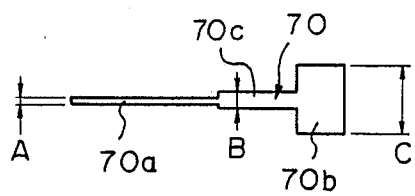
Figure 4:
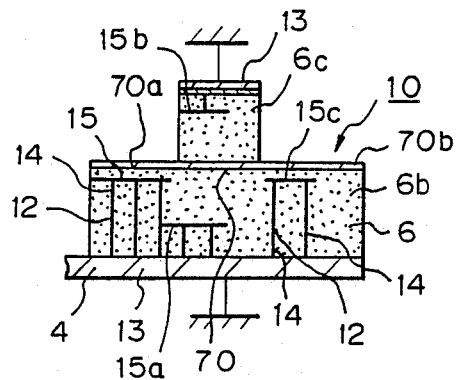

FIGS. 3 and 4 illustrate another embodiment of a package for a chip of ultra-high frequency, in which FIG. 3 is a plan view of the conductive passages in the package, and FIG. 4 is a cross-sectional view of the same package. This package 10 comprises an intermediate insulation layer 6b and an upper insulation layer 6c, both made of an alumina ceramic having a permittivity of 8.0. The pattern pitch of the conductive passages 70 formed on the upper surface of the intermediate insulation layer 6b is 0.65 mm and the pattern length of conductive passages 70 is 2 mm. The thickness of the intermediate insulation layer 6b is 0.4 mm and the thinkness of the upper insulation layer 6c is also 0.4 mm. In order to reduce the pattern width A of the inner leads 70a of the conductive passages 70 to 0.12 mm from 0.5 mm, which is the same width of the outer leads 70b, in such a manner that the characteristic impedance of the passages 70 is matched to 50 ohm, a horizontal adjusting layer 15, made of metallized film, for adjusting the characteristic impedance of the passages 70 is provided in the intermediate insulation layer 6b at positions coming downward, by 0.11 mm, from the lower surface of the inner leads 70a. Also, a plurality of via holes 14 filled with conductive material 12 are provided to extend downward from the adjusting layer 15 through the intermediate insulation layer 6b to the ground layer 13.

In addition, an lower and upper horizontal adjusting layers 15a and 15b are provided in the intermediate insulation layer 6b at a position just under a part of the lower surfaces of the inner leads 70a and the seal portions 70c and in the upper insulation layer 6c covering the seal portions 70c, respectively. The gap between the upper and lower adjusting layers 15a and 15b is 0.6 mm. A plurality of via holes 14 filled with conductive material 12 are provided in the intermediate and upper insulation layers 6b and 6c to extend downward and upward from these adjusting layers 15 to the lower and upper ground layers 13, respectively.

Also, in order to reduce the pattern width B at the seal portion 70c and a part of the outer lead 70b of the conductive passage 70 to 0.16 mm, a horizontal adjusting layer 15c, made of metallized film, for adjusting the characteristic impedance of the passages 70 is provided in the intermediate insulation layer 6b at a position coming downward, by 0.14 mm, from the lower surface of the outer leads 70b. A plurality of via holes 14 filled with conductive material are provided in the intermediate insulation layer 6b to extend downward from the adjusting layer 15c to the ground layer 13.

In the package 10 according to the embodiment shown in FIGS. 3 and 4, the width of the conductive pattern, i.e., the widths of the inner leads 70a, the seal portions 70c, and a part of the outer leads 70b, are smaller than those in the previous embodiment shown in FIGS. 1 and 2, so that the insulation characteristic defined between the adjacent inlet/outlet conductive passages can be more improved.

Figure 5:
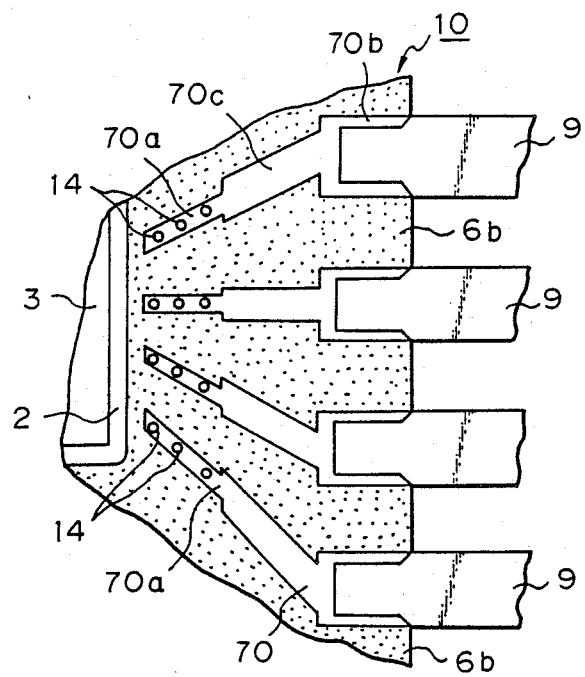
Figure 6:
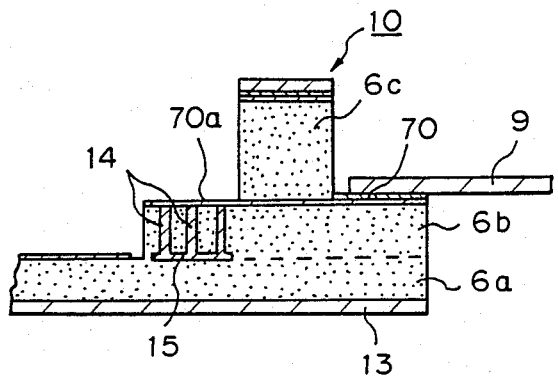
Figure 7:
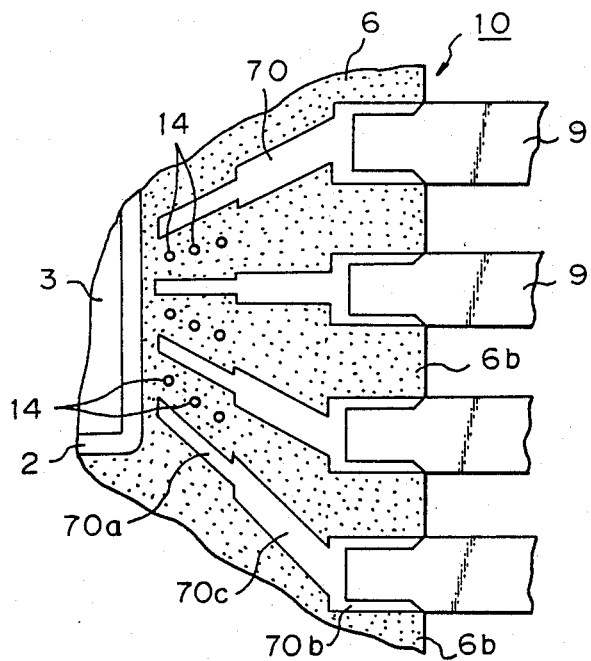
Figure 8:
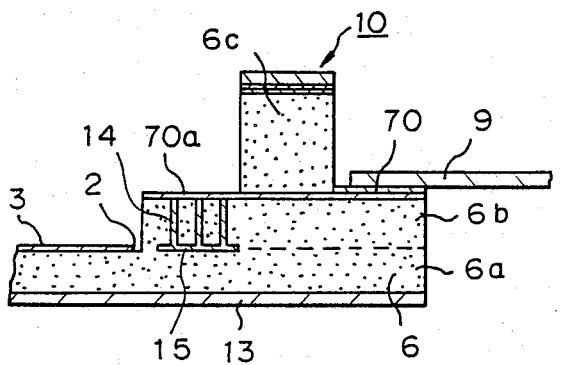

FIGS. 5 and 6 are plan and cross-sectional views, respectively, of still another embodiment of a package of this invention. FIGS. 7 and 8 are a plan and a cross-sectional views, respectively, of an embodiment similar to the package of FIGS. 5 and 6. In these embodiments, the package 10 comprises a plurality of via holes 14, filled with conductive material, which extend vertically downward to the lower surface of the intermediate insulation layer 6b from the lower surfaces of the inner leads 70a of the conductive passages 70, made of metallized layers, to which the conductive material is connected (FIGS. 5 and 6), or form the upper surface of the insulation layer 6b at positions between the adjacent inner leads 70a (FIGS. 7 and 8). Also, a horizontal adjusting layer 15, made of metallized film, is provided in an abutting face between the lower insulation layer 6a, on which a semiconductor chip is mounted, and the intermediate insulation layer 6b to connect to the conductive material in the plurality of via holes 14. The packages 10 shown in FIGS. 5 through 8 are constructed as mentioned above, so that the pattern width of the inner leads 70a of the conductive passages 70 is reduced so as to match to the characteristic impedance of the conductive passages 70.

Figure 9:
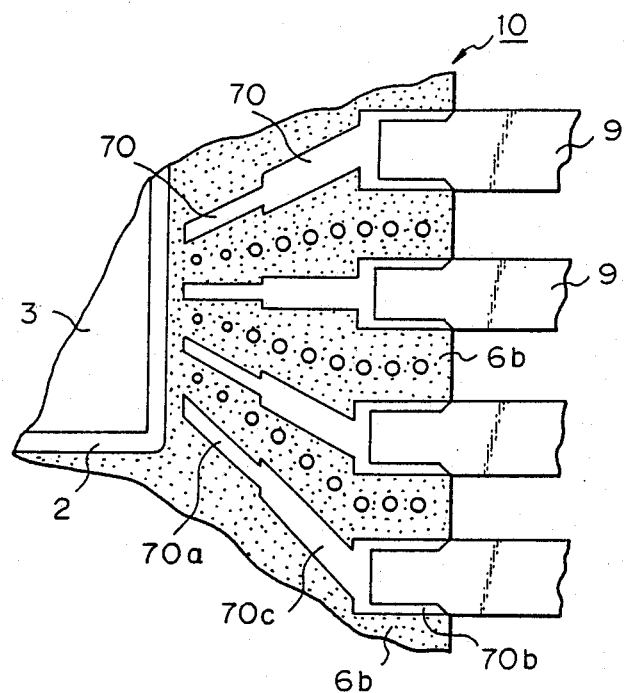
Figure 10:
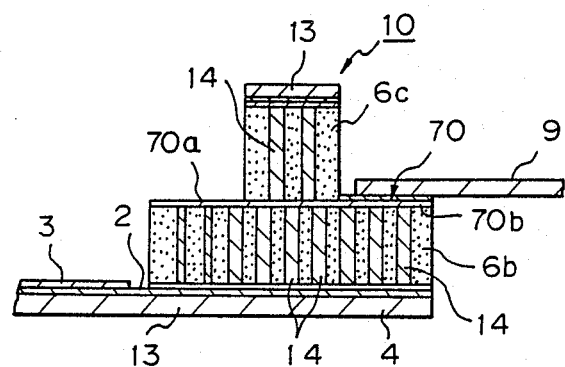

FIGS. 9 and 10 are plan and cross-sectional views, respectively, of a further embodiment of a package of this invention. This package 10 comprises a plurality of via holes 14, filled with conductive material, which are provided in the intermediate insulation layer 6b and regularly arranged at a constant pitch along substantially the entire length of the conductive passages 70 so as to extend vertically downward from the upper surface of the intermediate layer 6b at positions between the adjacent inner leads 70a to the lower surface of the intermediate layer 6b. Such a plurality of via holes 14 are also provided in the upper insulation layer 6c so as to extend vertically downward from the upper surface of the upper layer 6c to the lower surface of the upper insulation layer 6c. The conductive materials filled in these via holes 14 provided in the intermediate and upper insulation layers 6b and 6c are connected to the ground layers 13 formed on the lower surface of the upper insulation layer 6b and the upper surface of the upper insulation layer 6c. The package 10 shown in FIGS. 9 and 10 is constructed as mentioned above, so that the pattern width of the inner leads 70a of the conductive passages 70 is reduced so as to match to the characteristic impedance of the conductive passages 70.

Figure 11:
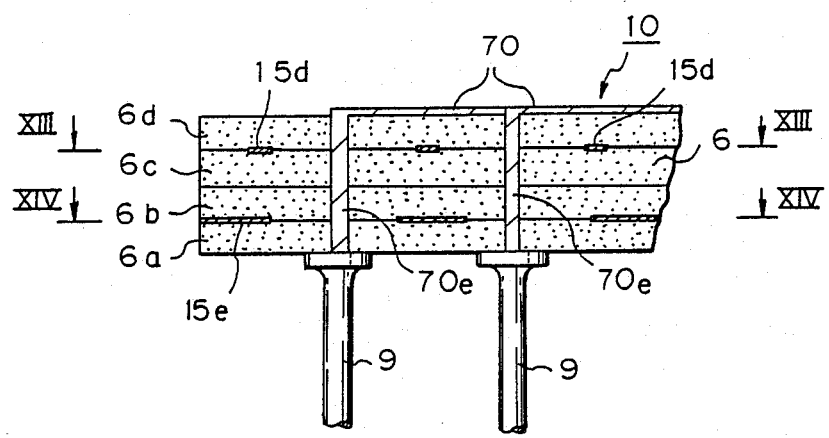
Figure 12:
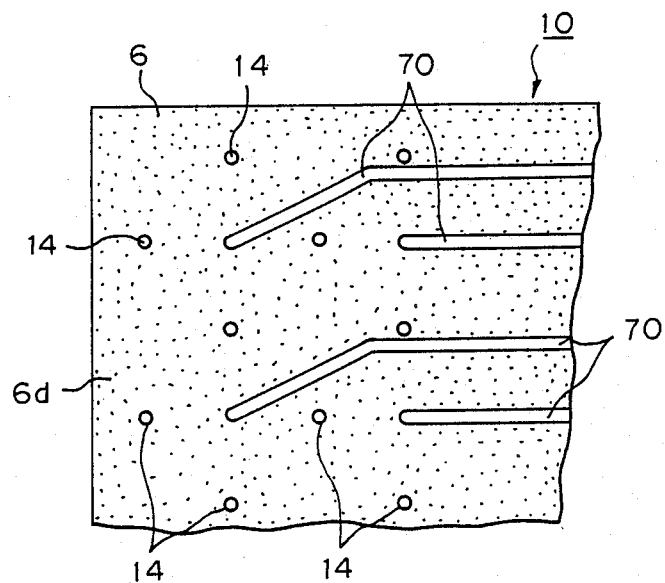
Figure 13:
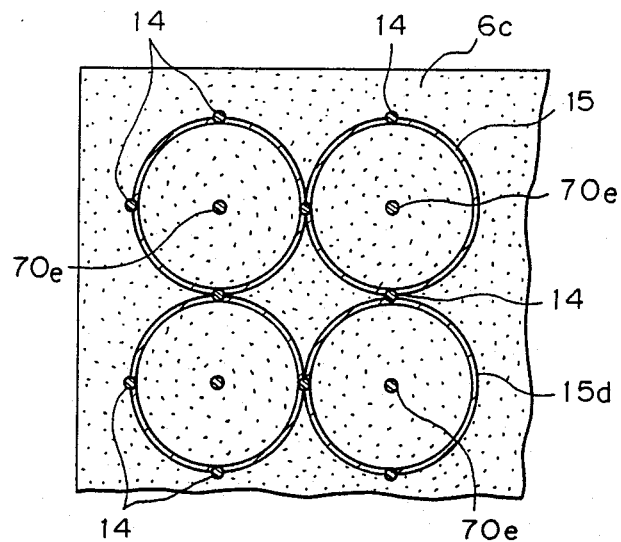
Figure 14:
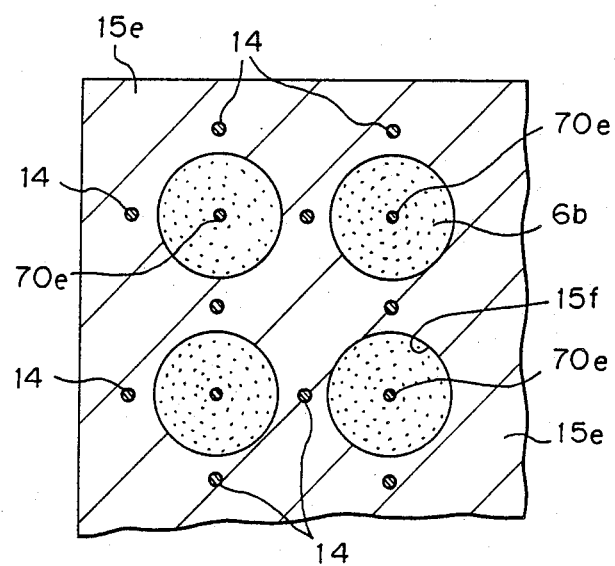

FIGS. 11 through 14 illustrate a still further embodiment of a package of this invention, in FIGS. 11 and 12 are a cross-sectional and a plan views of the package, respectively, and FIGS. 13 and 14 are horizontal cross-sectional view taken along lines XIII—XIII and XIV—XIV in FIG. 11 and illustrating an upper surface of the insulation layer 6c of this package and an upper surface of the insulation layer 6a of this package. The package of this embodiment comprises four insulation layers 6a, 6b, 6c, and 6d laminated of, such as, alumina ceramic substrates. A plurality of leads 9 are arranged in a lattice and mounted on the lower surface of the lowest insulation layer 6a. A part of each conductive passage 70 (as indicated at 70e) extends downward through the respective insulation layers from the upper conductive passage 70 formed on the upper surface of the uppermost layer 6a to the leads 9 on the lower surface of the lowest layer 6a to connect therebetween. Adjusting layers 15d and 15e, made of metallized films, are formed in the abutting faces between the insulation layers 6d and 6c, and 6b and 6a, respectively, to be spaced away by a certain distance from the vertical conductive passages 70e. Such adjusting layers are preferably ring-shaped (at 15d in FIG. 13) or have openings 15f (FIG. 14) around vertical conductive passages 70e. A plurality of via holes 14 (not shown in FIG. 11), filled with conductive material, are arranged or scattered and vertically extended in such a manner that the upper and lower adjusting layers 15d and 15e are connected to each other through the insulation layers, so that the characteristic impedance of the conductive passages 70 (and 70e) is matched.

In the package 10 of this embodiment shown in FIGS. 11 through 14, the via holes 14 provided in the insulation layers 6 may also be constructed as through holes, each having an inner peripheral wall formed of conductive material (as an adjusting layer 15) for adjusting the characteristic impedance of the conductive passages 70 (and 70e).

Figure 15:
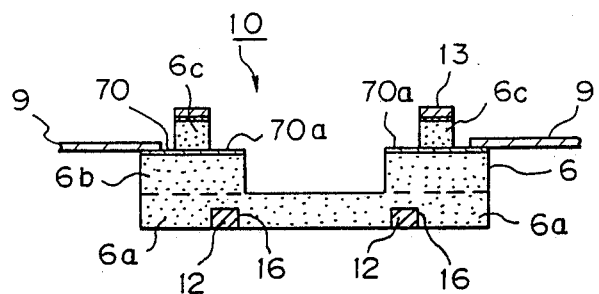
Figure 16:
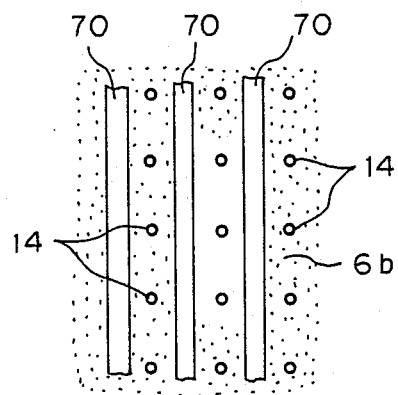
FIGS. 16 through 20 are views for explaining experimental results for the package of this invention.
Figure 17:
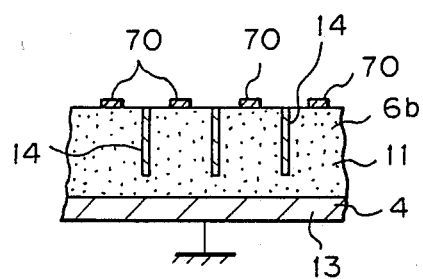
Figure 18:
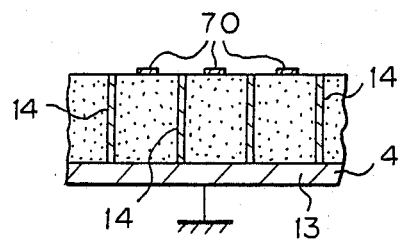
Figure 19:
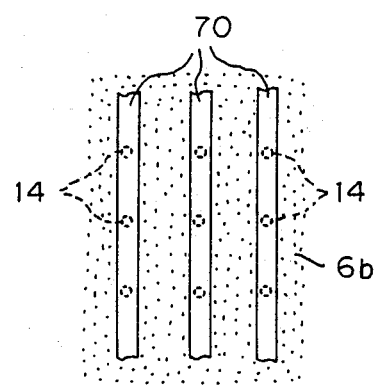
Figure 20:
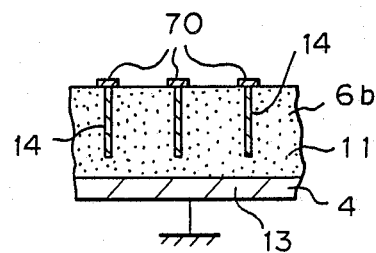
Figure 21:
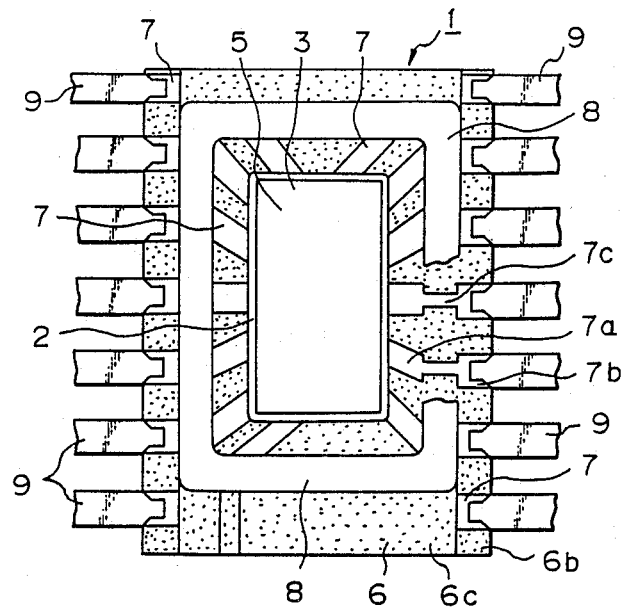
FIGS. 21 through 25 are views for explaining the constructions of chip packages known in the prior art.
Figure 22:
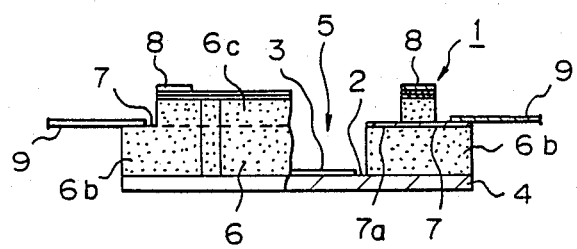
Figure 23:
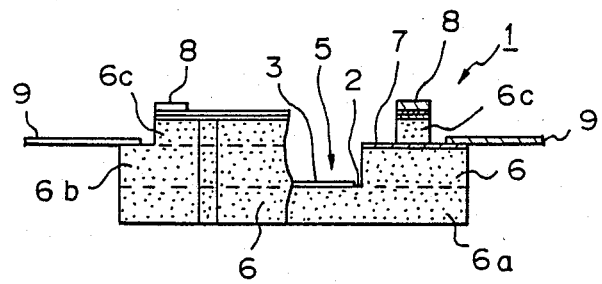

FIG. 15 is a cross-sectional view illustrating still another embodiment of a package 10 of this invention. The lower insulation layer 6a is provided on the lower surface thereof with recesses 16, having rectangular cross-sections, at positions just below the inner leads 70a of the conductive passages 70 formed on the intermediate insulation layer 6b. Each recess 16 is filled with adjusting material 12, such as conductive substance, for adjusting the characteristic impedance of the conductive passages 70 in order to locally change the permittivity of the insulation layer 6 at positions just below the inner leads 70a of the conductive passages 70 so as to reduce the pattern width of the inner leads 70a, so that the characteristic impedance of the conductive passages 70 is matched.

FIGS. 16 through 20 are views for explaining experimental results for the package of this invention. In the experiments, a package 10 was made as follows according to the embodiment shown in FIGS. 5 through 10. The conductive passages 70, made of metallized layers, the width thereof being 0.4 mm and the pattern pitch thereof being 1.27 mm, were formed on the upper surface of the intermediate insulation layer 6b, made of alumina ceramic, the thickness thereof being 0.4 mm and the permittivity thereof being 8.0. A plurality of via holes 14, the diameter thereof being 0.15 mm, filled with conductive material are arranged at a regular pitch of 0.3 mm in the intermediate insulation layer 6b at positions just below the conductive passages 70 or between the adjacent conductive passages 70 to extend vertically downward from the upper surface of the intermediate insulation layer 6lb so as to reach or not reach the ground layer 13.

According to the experiments, it has been found that, if the via holes 14, filled with adjusting material 12, i.e., conductive material, were provided in the intermediate insulation layer 6b at a regular pitch for adjusting the characteristic impedance of the conductive passages 70 at the positions just below the conductive passages 70 or between the adjacent conductive passages 70, as mentioned above, the characteristic impedance of the conductive passages 70 could be reduced by 10 to 15 ohm in comparison with a package having no such via holes 14. Therefore, it has been found that, in the packages shown in FIGS. 5 through 10, the pattern width A of the inner leads 70a of the conductive passages 70 can favorably be reduced so as to match to the characteristic impedance of the conductive passages 70 and to meet to the connecting pattern of a semiconductor chip of ultra-high frequency, which should be mounted on the package, so that the insulation performance between the adjacent conductive passages 70 can be increased.

We claim:

1. A package for mounting thereon a chip, such as a semiconductor chip, which can operate in a range of ultra-high frequency, comprising:
    an insulation layer on which input and output conductive patterns are formed, said insulating layer having a lower surface;
    a ground layer provided on the lower surface of said insulation layer; and
    adjusting means including electrical conductive material provided in said insulation layer in the vicinity of said conductive patterns for adjusting the characteristic impedance of said conductive patterns, said adjusting means comprising a conductive metallized layer and at least one via hole filled with said electrical conductive material connected to said metallized layer and said ground layer.

2. A package for mounting thereon a chip, such as a semiconductor chip, which can operate in a range of ultra-high frequency, comprising:
    a first insulation layer on which input and output conductive patterns are formed;
    a second insulation layer formed on said first insulation layer;
    said first and second insulation layers each having upper and lower surfaces;
    a first ground layer provided on the lower surface of said first insulation layer;
    a second ground layer provided on the upper surface of said second insulation layer; and
    adjusting means including electrical conductive material provided in said first and second insulation layers, respectively, and in the vicinity of said conductive patterns for adjusting the characteristic impedance of said conductive patterns;
    said adjusting means comprising metallized layers provided in said first and second insulation layers, respectively, and via holes filled with said electrical conductive material provided in said first and second insulation layers, respectively, connected to said metallized layers in said first and second insulation layers, respectively, and also connected to ground layers provided on said upper and lower surfaces of said first and second insulation layers, respectively.

3. A package for mounting thereon a chip, such as a semiconductor chip, which can operate in a range of ultra-high frequency, comprising:
    an insulation layer on which input and output conductive patterns are formed, each said pattern comprising an inner lead for connecting to said chip, an outer lead for connecting to an outside lead lines, and a portion for connecting said inner lead to said outer lead; and
    adjusting means including electrical conductive material provided in said insulation layer and in the vicinity of, at least, said inner leads of the conductive patterns for adjusting the characteristic impedance of said conductive pattern;
    said adjusting means comprising a metallized layer provided in said insulation layer and via holes filled with said electrical conductive material provided in said insulation layer, said via holes extending vertically downward from an upper surface of said insulation layer to said metallized layer.

4. A package as set forth in claim 3 wherein said plurality of via holes are arranged along a substantially entire length of said conductive patterns in such a manner that each via hole extends vertically downward from an upper surface of said insulation layer at a position just below said conductive pattern.

5. A package as set forth in claim 3, wherein said plurality of via holes are arranged along said inner leads of said conductive patterns in such a manner that each via hole extends vertically downward from an upper surface of said insulation layer at a position just below said conductive pattern.

6. A package as set forth in claim 3, wherein said via holes extend vertically downward from an upper surface of said insulation layer at positions between said adjacent conductive patterns.

7. A package as set forth in claim 6, wherein said via holes extend downwardly from the upper surface of said insulation layer at positions between said adjacent inner leads of the conductive patterns.

8. A package for mounting thereon a chip, such as a semiconductor chip, which can operate in a range of ultrahigh frequency, comprising:
    an insulation layer on which input and output conductive patterns are formed, a part of each said pattern extending through said insulation layer;
    adjusting means including electrical conductive material provided in said insulation layer and in the vicinity of said conductive patterns for adjusting the characteristic impedance of said conductive patterns; and,
    said adjusting means comprising a metallized layer having openings, so that said part of each pattern passes through said opening.

9. A package as set forth in claim 8, wherein said adjusting means comprising a plurality of ring-shaped metallized layers, so that said part of each pattern passes through said opening of said ring-shaped metallized layer.

10. A package for mounting thereon a chip, such as a semiconductor chip, which can operate in a range of ultra-high frequency, comprising:
    an insulation layer on which input and output conductive patterns are formed, each said pattern comprising an inner lead for connecting to said chip, an outer lead for connecting to an outside lead line, and a portion for connecting said inner lead to said outer lead; and adjusting means including electrical conductive material provided in said insulation layer and in the vicinity of, at least, said inner leads of the conductive patterns for adjusting the characteristic impedance of said conductive pattern;

said adjusting means comprising a metallized layer provided in said insulation layer and via holes filled with said electrical conductive material provided in said insulation layer, said via holes extending vertically downward from an upper surface of said insulation layer at a position just below said conductive patterns to said metallized layer and being arranged along substantially the entire length of said conductive patterns.

11. A package for mounting thereon a chip, such as a semiconductor chip, which can operate in a range of ultra-high frequency, comprising:

an insulation layer on which input and output conductive patterns are formed, each said pattern comprising an inner lead for connecting to said chip, an outer lead for connecting to an outside lead line, and a portion for connecting said inner lead to said outer lead; and adjusting means including electrical conductive material provided in said insulation layer and in the vicinity of, at least, said inner leads of the conductive patterns for adjusting the characteristic impedance of said conductive pattern;

said adjusting means comprising a metallized layer provided in said insulation layer and via holes filled with said electrical conductive material provided in said insulation layer, said via holes extending vertically downward from an upper surface of said insulation layer at a position just below said conductive pattern to said metallized layer and being arranged along said inner leads of said conductive patterns.

* * * * *

UNITED STATES PATENT AND TRADEMARK OFFICE
CERTIFICATE OF CORRECTION

PATENT NO. : 4,890,155
DATED : December 26, 1989
INVENTOR(S) : FUMIO MIYAGAWA et al.

It is certified that error appears in the above-identified patent and that said Letters Patent is hereby corrected as shown below:

Column 1, line 9, "operates" should be --operate--;
              line 34, after "example" insert a comma --,--.
    Column 4, line 59, delete "an".
    Column 5, line 34, "form" should be --from--.
    Column 7, line 5, "61b" should be --6b--.
    Column 8, line 23, after "claim 3" insert a comma --,--;
              line 45, "ultrahigh" should be --ultra-high--.

Signed and Sealed this

Eighth Day of January, 1991

Attest:

HARRY F. MANBECK, JR.

*Attesting Officer*                 *Commissioner of Patents and Trademarks*